(12) United States Patent
Findlay et al.

(10) Patent No.: US 8,461,530 B2
(45) Date of Patent: Jun. 11, 2013

(54) SENSOR ARRAY MICROCHIP

(75) Inventors: Ewan Findlay, Dollar (GB); Sara Pellegrini, Edinburgh (GB)

(73) Assignee: STMicroelectronics (Research & Development) Ltd, Marlow, Buckinghamshire (GB)

( * ) Notice: Subject to any disclaimer, the term of this patent is extended or adjusted under 35 U.S.C. 154(b) by 21 days.

(21) Appl. No.: 13/242,448

(22) Filed: Sep. 23, 2011

(65) Prior Publication Data

US 2012/0132806 A1    May 31, 2012

(30) Foreign Application Priority Data

Nov. 30, 2010    (GB) .................................. 1020270.3

(51) Int. Cl.
*G01J 5/00*    (2006.01)
(52) U.S. Cl.
USPC ....................................................... 250/338.1
(58) Field of Classification Search
USPC ................... 250/330–335, 336.1–336.2, 337, 250/338.1–338.5, 339.01–339.15, 340, 341.1–341.8, 342–353
See application file for complete search history.

(56) References Cited

U.S. PATENT DOCUMENTS

| | | | | |
|---|---|---|---|---|
| 3,958,118 A * | 5/1976 | Schwarz | ...................... | 250/221 |
| 6,756,591 B1 * | 6/2004 | Lounis et al. | .............. | 250/316.1 |
| 2004/0188617 A1 * | 9/2004 | Devitt et al. | ................ | 250/338.1 |
| 2006/0202129 A1 | 9/2006 | Niclass et al. | | |
| 2006/0249757 A1 | 11/2006 | Kamasz et al. | | |
| 2007/0295893 A1 | 12/2007 | Olsen et al. | | |
| 2009/0121137 A1 * | 5/2009 | Liddiard | .................... | 250/338.1 |
| 2010/0102230 A1 | 4/2010 | Chang et al. | | |
| 2010/0230594 A1 | 9/2010 | Honda et al. | | |
| 2010/0264297 A1 | 10/2010 | Kurahashi | | |

FOREIGN PATENT DOCUMENTS

JP    2008124237 A    5/2008

OTHER PUBLICATIONS

United Kingdom Search Report mailed Mar. 10, 2011 for GB 1020270.3 (2 pages).

* cited by examiner

*Primary Examiner* — Kiho Kim
(74) *Attorney, Agent, or Firm* — Gardere Wynne Sewell LLP (57) ABSTRACT

A sensor array microchip apparatus includes a substrate and a lens positioned over the substrate. A plurality of radiation sensor elements are formed on the substrate in an array format and spatially separated from each other. The substrate further includes power supply circuitry (generating power for the radiation sensor elements) and processing circuitry (operable to control and process information from the radiation sensor elements). The power supply circuitry and said processing circuitry are positioned on the substrate within the array between two or more of the radiation sensor elements. The lens, in combination with the spatial separation of the radiation sensor elements in the array format, defines a relatively wide (30-80 degrees) field of regard for the sensor.

31 Claims, 5 Drawing Sheets

SENSOR ARRAY MICROCHIP

PRIORITY CLAIM

This application claims priority from United Kingdom Application for Patent No. 1020270.3 filed Nov. 30, 2010, the disclosure of which is hereby incorporated by reference.

TECHNICAL FIELD

The invention relates to a sensor array microchip. That is, a microchip having arranged on a substrate an array of sensor elements. The invention may be particularly related to, but not limited to, a light sensor array microchip such as an ambient light sensor.

BACKGROUND

Digital light sensing based upon solid state technology is well known, the two most common types of light sensors currently being charge coupled devices (CCD's) and complementary metal oxide semiconductor (CMOS) light sensors. Digital light sensors are incorporated within a wide variety of devices throughout the consumer, industrial and defense sectors among others.

A light sensor is a device comprising one or more radiation sensitive elements having an electrical property that changes when radiation is incident upon them, together with circuitry for converting the changed electrical property into a signal. As an example, a light sensor may comprise a photodetector that generates a charge when radiation is incident upon it. The photodetector may be designed to be sensitive to electromagnetic radiation in the range of (human) visible wavelengths, or other neighboring wavelength ranges, such as infra red or ultra violet for example. Circuitry is provided that collects and carries the charge from the radiation sensitive element for conversion to a value representing the intensity of incident radiation.

Typically, more than one radiation sensitive element will be provided in an array. The term pixel is generally used as shorthand for picture element. In the context of digital light sensing, a pixel refers to that portion of the light sensor that contributes one value representative of the radiation intensity at that point on the array. These pixel values may be combined to represent light sensed by the sensor.

Pixels are usually formed on and/or within a semiconductor substrate. In fact, the radiation sensitive element comprises only a part of the pixel, and only part of the pixel's surface area (the proportion of the pixel area that the radiation sensitive element takes up is known as the fill factor). Other parts of the pixel are taken up by metallization such as transistor gates and so on. Other image sensor components, such as readout electronics, analog to digital conversion circuitry and so on may be provided at least partially as part of each pixel, depending on the pixel architecture.

When sensing levels of ambient light it is desirable for light from a large area to contribute to the overall level of ambient light sensed. That is, an ideal ambient light sensor can be said to take in light from across an entire hemisphere of illumination surrounding an input window of a sensor package. Ambient light sensors therefore require a large (or wide) field of regard. The wider the field of regard, the more accurate the measured level of ambient light may be.

An ambient light sensor generally comprises a single radiation sensitive element such as a photodiode; however ambient light sensors may comprise a plurality of radiation sensitive elements. Each radiation sensitive element is termed a pixel. The pixels may form part of a charge coupled device (CCD) or complimentary metal-oxide semiconductor (CMOS) light sensor. Other components such as lenses and mounts may be added to produce an ambient light sensor package for installation in an electronic device.

Generally, ambient light sensors may comprise a low number, e.g. one, four, nine or sixteen, of radiation sensitive elements or pixels arranged in a square matrix on a substrate such as a silicon substrate. However, ambient light sensors with more pixels may be envisaged. Each pixel is arranged to abut adjacent pixels to leave no space in between pixels. The pixels are therefore arranged in a pixel array. A pixel array is a type of sensor array specific to light sensors.

Ambient light sensors are configured to give an indication of the ambient light surrounding a device. Information concerning ambient light may be used e.g. to control the brightness of a display on a device. Ambient light sensors are not generally required to produce an image and are required to be small so as not to occupy valuable space in a device. They are therefore required to have small pixel arrays when compared to the large pixel arrays, e.g. 2 megapixel, of camera module microchips.

The term "field of regard" is used herein to encompass the maximum angle from which light incident on a sensor package may be detected by pixels in a pixel array. In the case of an ambient light sensor package, the light incident on the pixel array is used to measure the level of ambient light. A field of regard may be expressed in terms of a half-angle of a viewing cone. That is an angle may be defined from a normal, which is perpendicular to a pixel or pixel array; the angle defines the maximum angle from which light may be incident on the pixel or pixel array.

It is noted that the shape of a viewing cone that defines a field of regard is dependent on the shape of a pixel array to which it relates. That is, if the pixel array is square, then the viewing cone will form an inverted square based pyramid. If the pixel array is circular, then the viewing cone will form an inverted circular based pyramid.

The field of regard is therefore defined by the interrelationship between a pixel array and a lens forming part of a sensor package. Taking the ideal ambient light sensor package example referred to above in which light is sensed across an entire hemisphere of illumination, the half-angle would be ninety degrees. In other ambient light sensor packages, the half-angle may be less than ninety degrees.

The term "pixel" as used herein encompasses an individual radiation sensitive element or sensor element arranged on a substrate. The term "sensor array" as used herein encompasses an array of sensors arranged on a substrate. A pixel array is a type of sensor array. The term "sensor array microchip" as used herein encompasses a sensor or a sensor array and a substrate on which the sensors are arranged. The term "sensor package" as used herein encompasses a collection of elements that together form at least part of a complete sensor module or unit suitable for installation in a device. For example, an ambient light sensor package may comprise a sensor array microchip comprising pixels arranged in a pixel array on a substrate, a lens, a lens mount and a collection of electronic elements required for operation of the sensor package.

Generally, a field of regard of an ambient light sensor package may be increased in three ways: if a lens of fixed focal length is present by widening or enlarging a pixel array; by decreasing a distance between a pixel array and a lens within the ambient light sensor package while also reducing the focal length of the lens accordingly; and where no lens is used by reducing the distance between the pixel array and the window aperture or increasing the window aperture size.

Figure 1:
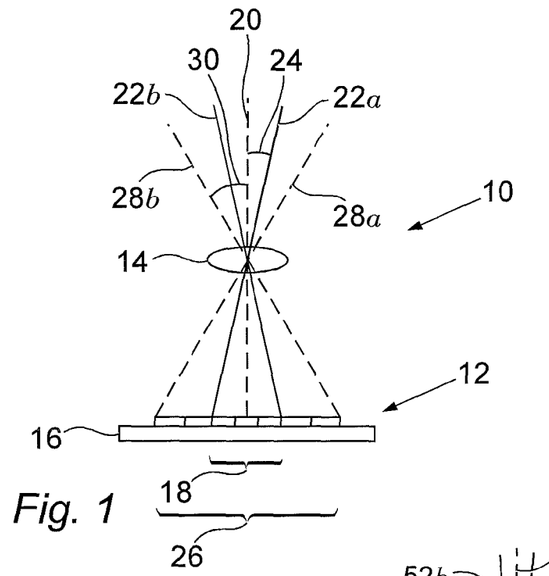
FIG. 1 shows a section through an ambient light sensor package showing the effect of altering the number of pixels in a pixel array on the field of regard.

Referring to FIG. 1, an effect of altering the number of pixels in a pixel array on the field of regard of a sensor package is shown.

The sensor package 10 comprises a sensor array microchip 12 and a lens 14. The sensor array microchip comprises a substrate 16 and a series of pixels arranged in a pixel array 18. A normal 20 is shown that is perpendicular to the pixel array 18 and that passes through the center of the lens 14. In addition, a field of regard is defined by the outer boundaries 22a, 22b. The field of regard has a half-angle 24 and is determined by the relative arrangement of the pixel array 18 and the lens 14. The field of regard of the sensor package 10 indicates the maximum angle at which light incident on the lens 14 may still be sensed by the pixel array 18.

If the pixel array 18 is extended to include all the pixels of an extended pixel array 26 then the half-angle of the field of regard is increased to an extended half-angle 30. This can be seen by extended limits 28a, 28b of a field of regard defined by the relative arrangement of the extended pixel array 26 and the lens 14.

However, by increasing the number of pixels arranged on the substrate 16, the size of the microchip, and therefore the sensor package, may be increased. This is because the area of substrate surrounding the pixel arrays 18, 26 is used to hold support electronic components necessary to operate the sensor array microchip 12. If the size of the pixel array 18 is increased to include the pixels of the extended pixel array 26 then the inclusion of support electronics on the substrate 16 would result in a larger microchip.

Alternatively, if the size of the microchip is maintained then there is less area of substrate available on which to place any support electronics components.

Figure 2:
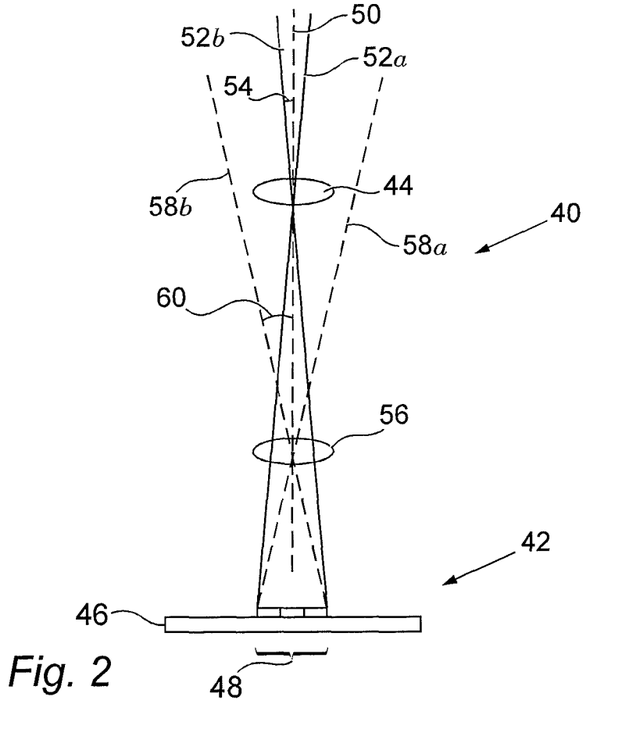
FIG. 2 shows a section through an ambient light sensor package showing the effect of moving a lens closer to a pixel array on the field of regard.

Referring to FIG. 2, the effect of moving a lens closer to a pixel array on the field of regard of a sensor package is shown. A prior art sensor package 40 comprises a sensor array microchip 42 and a lens 44. As with the sensor package of FIG. 1, the sensor array microchip 42 comprises a substrate 46 and a pixel array 48. A normal 50 is shown perpendicular to the pixel array 48 and extending through the center of the lens 44.

The field of regard defined by the relative arrangement of the pixel array 48 and the lens 44 is shown by field of regard limits 52a, 52b defining a half-angle 54.

If the lens 44 is replaced with a lens 56 positioned closer to the pixel array 48 then the field of regard is widened. This is shown by the extended field of regard limits 58a, 58b that define an extended half-angle 60 increased relative to the half-angle 54.

However, widening the field of regard by moving the lens 44 closer to the pixel array 48 results in an ambient light sensor package that is difficult to manufacture. This is because bringing the lens 44 closer to the pixel array 48 requires greater accuracy of lateral placement and orientation of the lens 44. That is, if the center of the lens 44 is positioned slightly to one side of the normal then the effect would be to skew the field of regard of the sensor. This effect is more pronounced with a lens positioned closer to the pixel array 48 and may adversely affect the operation of an ambient light sensor package.

When moving the lens 44 closer to the pixel array 48 the radius of curvature of the lens 44 must be adjusted to change the optical power of the lens 44. This is required to alter the focal length of the lens 44 to maintain the level of focus of light onto the pixel array 48.

The skilled person will understand that FIGS. 1 and 2 are sections through ambient light sensor packages and as such only show the dimensions of pixel arrays in one direction. Pixel arrays may be arranged as squares, rectangles or other shapes on a substrate. The same principles for field of regard and half angle apply to a section through a sensor package taken at right angles to that of FIGS. 1 and 2. The skilled person will therefore appreciate that the shape of the field of regard is dependent on the shape of the pixel array.

Proximity sensor packages generally comprise at least one light radiating source and at least one radiation sensitive element or pixel. The at least one light radiating source may for example be an infra-red light emitting diode (LED) and the at least one light sensor may for example be a photodiode. The LED transmits infra-red light and the detection of reflected infra-red light onto the at least one pixel signals the proximity of an object to the proximity sensor package.

SUMMARY

According to the present disclosure there is provided a sensor array microchip comprising: a substrate; and a plurality of sensor elements arranged on the substrate, wherein each of the plurality sensor elements is spatially separated from at least one other of the plurality of sensor elements.

Spatial separation of the sensor elements on the substrate provides advantages associated with a wide sensor element array without sensor elements occupying a large surface area of the substrate. Spatially separated sensor elements may, for example, provide a wide field of regard of a light sensor without a large number of pixels. Spatially separated sensor elements may also, for example, provide space in which other electronic elements may be placed. The other electronic elements may be, for example, a power supply or a microprocessor. Such elements are generally required to allow the microchip to perform the tasks for which it is intended and may normally be placed around the outside of the sensor elements. By spatially separating the sensor elements advantages associated with a wide sensor array may be provided without the need to increase the size of the microchip and still allowing space for the additional electronic elements.

Optionally, the spatially separated sensor elements may be arranged to allow additional electronic elements to be arranged on the substrate between the sensor elements.

Optionally, at least one of the plurality of sensor elements may comprise a pixel.

Optionally, the plurality of sensor elements may be distributed in a matrix and one or more elements of the matrix may comprise one or more of the plurality of sensor elements.

Optionally, the matrix may be a square matrix.

A square or rectangular matrix provides favorable conditions regarding routing of tracks and connections between the sensor elements and any additional electronic elements arranged on the substrate between the plurality of sensor elements.

Optionally, the plurality of sensor elements may comprise single photon avalanche diodes.

According to the present disclosure in a second aspect there is provided an ambient light sensor package comprising a sensor array microchip as described above wherein the two or more pixels comprise ambient light pixels.

If the sensor array microchip is an ambient light sensor package then the spatial separation of the light sensors provides a wide field of regard without the need for additional sensors and without the need for space around the outside of the sensors for additional electronic components.

Optionally, the ambient light sensor package may further comprise a lens connected to a mount and the mount may be secured to the substrate to hold the lens in a fixed orientation to the substrate, and the two or more ambient light pixels may be positioned to cooperate with the lens to define a wide field of regard of the sensor array microchip.

Optionally, the wide field of regard may have a half angle of ninety degrees.

Optionally, the wide field of regard has a half angle of between forty-five degrees and seventy degrees.

Optionally, the ambient light sensor package may further comprise a microprocessor configured to calculate the ambient light present within the field of regard by interpolating across the field of regard the outputs of the two or more ambient light pixels.

By interpolating the outputs of the two or more ambient light sensors an estimate of the ambient light level across the entire field of regard may be calculated using the spatially separated plurality of sensor elements. This means that fewer sensors are required on the sensor array microchip to calculate the ambient light estimate.

Optionally, the ambient light sensor package may further comprise a filter configured to allow light of at least one predetermined frequency to pass onto the two or more ambient light pixels.

Optionally, the filter may be configured to allow photopic light to pass onto the two or more ambient light pixels.

According to the present disclosure in a third aspect there is provided a combined ambient light sensor package and proximity sensor package comprising an ambient light sensor package as described above, wherein the plurality of sensor elements further comprise at least one proximity pixel positioned to cooperate with the lens to define a narrow angle of regard relative to the wide angle of regard.

Combining an ambient light sensor package and a proximity sensor package provides space savings within a device, for example a hand held device such as a mobile telephone, which requires both of those functions. By using one of the two or more ambient light sensors also as a proximity sensor the need for separate sensors is removed and a more efficient combined sensor may be produced.

Optionally, the at least one proximity pixel may comprise a single photon avalanche diode.

Optionally, the two or more ambient light pixels may comprise the at least one proximity pixel.

Optionally, the filter may be further configured to allow infra-red light to pass onto the at least one proximity pixel.

This feature removes the need for two filters, one to pass photopic light, the other to pass infra-red light.

Optionally, the two or more ambient light pixels, the at least one proximity pixel, the lens and the filter may be configured to focus photopic light on the two or more ambient light pixels, and infra-red light on the at least one proximity pixel.

According to the present disclosure in a fourth aspect there is provided a device comprising a sensor array microchip as described above.

According to the present disclosure in a fifth aspect there is provided a device comprising an ambient light sensor package as described above.

According to the present disclosure in a sixth aspect there is provided a device comprising a combined ambient light sensor package and proximity sensor package as described above.

BRIEF DESCRIPTION OF THE DRAWINGS

Exemplary embodiments of the invention will now be described with reference to the accompanying figures, in which.

DETAILED DESCRIPTION OF THE DRAWINGS

In order to manufacture a dual band sensor system, e.g. an ambient light sensor and a proximity sensor, multiple pixels must be arranged on separate sensor array microchips. The separate sensor array microchips form a separate ambient light sensor package and a separate proximity sensor package each with a separate sensor window. The sensor windows in these systems comprise band pass filter material and are separate to allow them to dictate a sensor optical characteristic and therefore the function of the sensor.

For example a filter which mimics the photopic response of the human eye can be placed on top of silicon photodiode and its output can be used to calculate the incident light level in lumens. Alternatively, an infra-red pass filter can be applied to a similar photodiode, matching its optical receiving bandwidth to that of an emitter such as an LED. The level of the incident light such a photodiode can allow estimation of the proximity of an object within the field of regard of the sensor package.

The inventors have realized that if a filter allowing separation of the two channels for ambient light sensing and proximity sensing can be implemented in a single cavity then a dual band sensor may be implemented using a single microchip. However, this requires a means of providing a wide field of regard for the ambient light sensing elements and a narrow field of regard for proximity detection.

Figure 3:
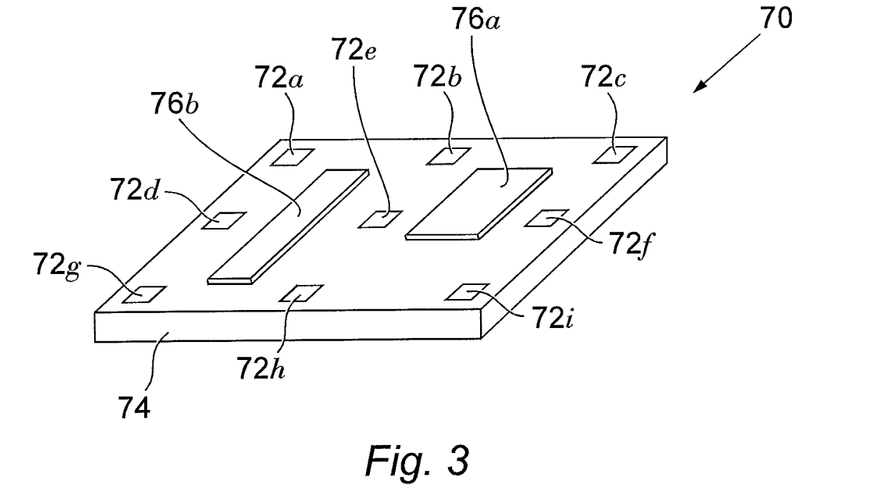
FIG. 3 shows a sensor array microchip according to an embodiment of the present disclosure.

Referring to FIG. 3, a sensor array microchip 70 according to embodiments of the invention is shown. A plurality of pixels 72*a-i* are arranged on a substrate 74. The pixels may be formed on a silicon substrate using microchip manufacturing techniques that will be well known to one of skill in the art. The sensor array microchip of FIG. 3 comprises pixels and is therefore a light sensor. However, the skilled person will appreciate that the sensor array microchip may comprise other sensors.

The plurality of pixels 72*a-i* are arranged on the substrate 74 to be spatially separated wherein the spatially separated pixels 72*a-i* are arranged to allow additional electronic elements 76*a*, 76*b* to be arranged on the substrate between the pixels 72*a-i*.

The additional electronic elements 76*a*, 76*b* (or support electronics) may for example be power supply electronics arranged to provide or regulate a power supply to the pixels 72*a-i*, or a microprocessor configured to control the operation of the microchip 70. Other support electronics may also be arranged on the substrate The skilled person will appreciate that advantages of space saving are provided by a sensor array microchip 70 as shown in FIG. 3. This is because the support electronics 76*a*, 76*b* are not required to be positioned around the outside of the sensor array but may be placed in between the pixels 72*a-i* of the pixel array. By spatially distributing the pixels 72*a-i* around the substrate 74 a wide field of regard may be produced without increasing the surface area of the substrate 74 occupied by the pixels 72*a-i*. The size of the sensor array microchip 70 need not therefore be increased to accommodate support electronics 76*a*, 76*b*. The sensor array microchip 70 can therefore provide the advantages of a large sensor array without the need for additional sensors or the need to increase the size of the microchip.

The arrangement of the present disclosure as set out in FIG. 3 may also be used in any application where sparse sampling is of use. This may include for example, gesture recognition, where we only need to know an approximate position of a hand of a user. The present disclosure may also be used in other sparse pattern recognizers such as a sensor employing specific spectroscopic signature recognition and/or bespoke chemical signature recognition.

The plurality of pixels 72*a-i* are arranged on the substrate 74 in a matrix. The matrix is a nine element (3×3) square matrix. Each element of the matrix comprises a single pixel. As used herein, the term "element" when referring to a matrix encompasses a separate area of a matrix arranged in a grid pattern. For example a 3×3 matrix comprises nine elements arranged in a 3×3 grid.

Each element of a matrix may comprise zero, one or a plurality of pixels. For example, the matrix element comprising pixel 72*e* (the central matrix element of the 3×3 matrix) may in some embodiments of the present disclosure comprise no pixel. In other embodiments, the central matrix element may comprise one pixel. In further embodiments of the present disclosure the central matrix element may comprise a plurality of pixels.

In addition, the one or more pixels need not fill the matrix element. That is, the matrix element may cover a wider surface area than the one or more pixels.

The skilled person will further appreciate that the matrix may be a square or a rectangular matrix. Further, the pixels may not be arranged in a square or rectangular matrix at all and may be arranged in any other configuration to suit a particular application.

Arranging the pixels in a square or rectangular matrix is particularly advantageous when additional electronic elements such as the support electronics are positioned between the pixels 72*a-i* as this arrangement makes routing of connections and tracks to and from the support electronics easier to design and manufacture.

The arrangement of FIG. 3 is particularly advantageous when used in ambient light sensor packages. In accordance with an embodiment of the present disclosure the sensor array microchip may be an ambient light sensor package. In such embodiments the plurality of pixels comprises ambient light pixels.

As used herein, the term "ambient light pixel" encompasses a pixel of the plurality of pixels designated for use in ambient light sensing. An ambient light pixel may for example be configured specifically for sensing ambient light. That is, the configuration of an ambient light pixel may be particularly advantageous when sensing ambient light. For example a filter formed on an ambient light pixel may only allow photopic light to pass. Alternatively, an ambient light pixel may have the same configuration as another pixel in the plurality of pixels; in this instance the term "ambient light pixel" is a nominal term used to define those pixels used for sensing ambient light.

The requirement for a wide field of regard for an ambient light sensor package comes from the requirement to integrate ambient light across a hemisphere of illumination which is incident onto a surface. The wider the field of regard, the more of the ambient light within the hemisphere of illumination will be incident on the ambient light pixels of the ambient light sensor package and the more accurate the measurement of the ambient light.

In applications where an ambient light sensor package is adapted for use in a device, such as a mobile telephone, the ambient light is measured in order to determine how it may affect a display of the device.

If the ambient light is assumed to interact with the behavior of a display on the device, the sensor can have a narrower than 2π steradians field of regard or viewing cone. For the avoidance of doubt it is noted that a 2π steradians field of regard is equivalent to a field of regard having a half angle of ninety degrees. The viewing cone defines the field of regard of an ambient light sensor package as discussed above. The viewing cone may be selected to be coincident with the range of angles most likely to dull the perceived brightness of a display on the device. The viewing cone may for example have a half-angle between forty-five degrees and thirty degrees dependant on the display and the degree of accuracy in light detection required.

Figure 4:
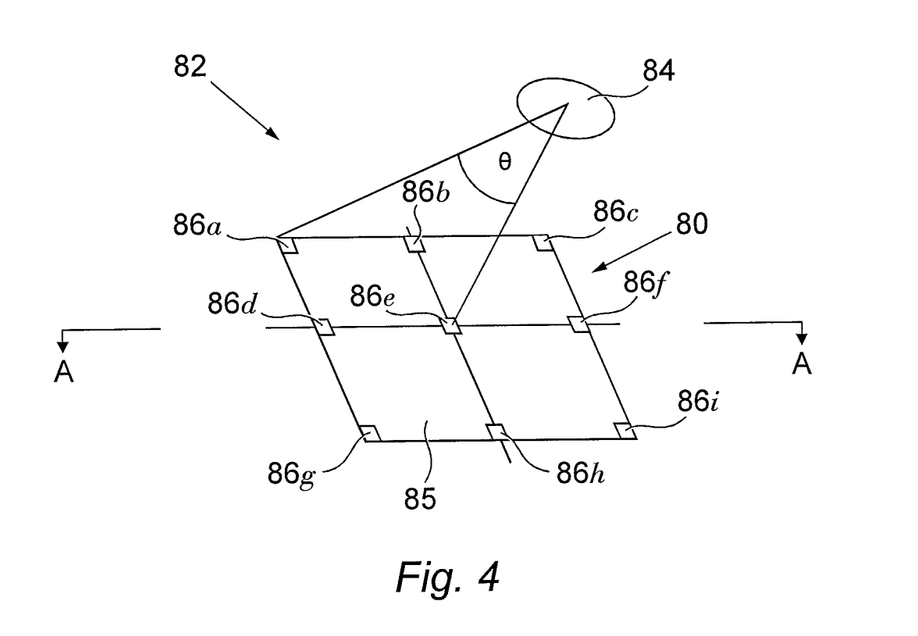
FIG. 4 shows a sensor array microchip according to an embodiment of the present disclosure arranged as an ambient light sensor package or a combined ambient light sensor package and proximity sensor package.

Referring to FIG. 4, there is shown a sensor array microchip 80, which is used as part of an ambient light sensor package 82. The ambient light sensor package further comprises a lens 84, which focuses light onto the sensor array microchip 80. The sensor array microchip comprises a nine element spatially separated pixel array 86*a-i* arranged on a substrate 85.

As will be appreciated by the skilled person, the lens 84 may be set within a mount (not shown) which is fixed to the substrate 85. The mount holds the lens 84 in a fixed orientation to the substrate 85 and, thereby, to the pixels 86*a-i* of the spatially separated pixel array. The mount may be glued to the substrate.

Figure 5:
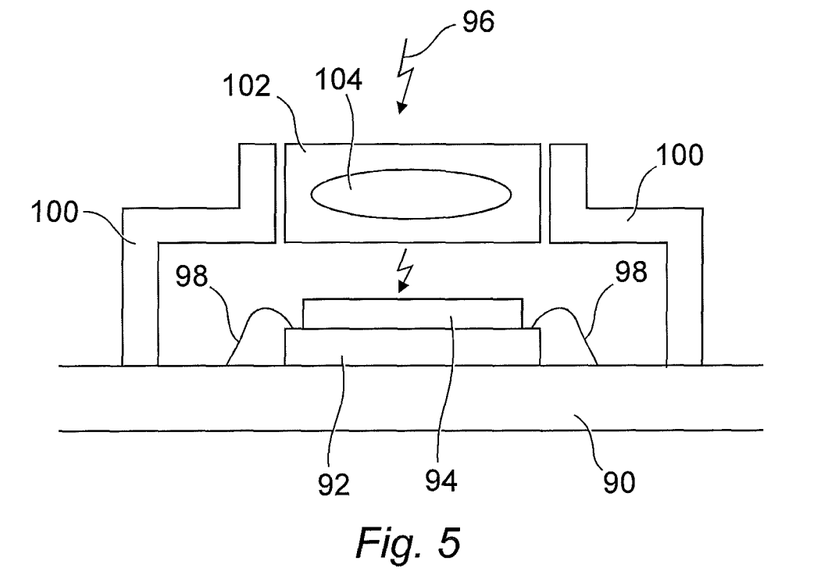
FIG. 5 shows a section through a light sensor package according to an embodiment the present disclosure.
Figure 6:
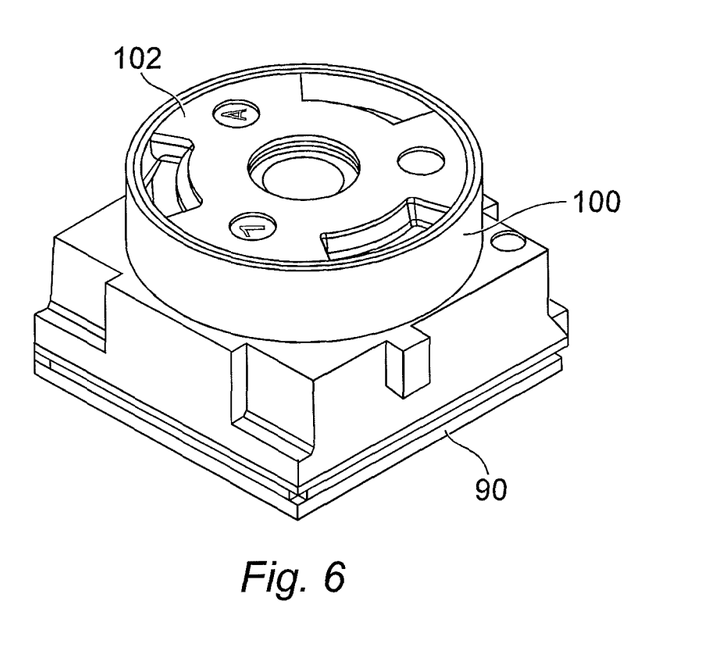
FIG. 6 shows a perspective view of a light sensor package according to an embodiment the present disclosure.

FIG. 5 shows a typical sensor package of the type mentioned above. Selected components are shown for ease of illustration in the present disclosure and it is to be understood that other components could be incorporated into the structure. A substrate 90 is provided upon which an imaging die 92 is assembled. The substrate 90 could be a PCB, ceramic or other material. The imaging die 92 comprises a radiation sensitive portion 94 which collects incident radiation 96. For an ambient light sensor the radiation sensitive portion will usually be photosensitive and the incident radiation 96 will usually be light including light in the (human) visible wavelength ranges as well as perhaps infrared and ultraviolet. Bond wires 98 are provided for forming electrical connections with the substrate 90. Other electrical connections are possible, such as solder bumps for example. A number of electrical components are formed in the body of the imaging die 92 and/or the substrate 90. These components control the ambient light sensing and readout operations and are required to switch at high speed. The module is provided with a mount 100, a lens housing 102 and lens 104 for focusing incident radiation 96 onto the radiation sensitive portion of the ambient light sensor. FIG. 6 shows a perspective view of the apparatus of FIG. 3, showing the substrate 90, mount 100, and lens housing 102. In some embodiments of the present disclosure the lens housing 102 and the mount 100 may be manufactured as a single component.

Figure 7:
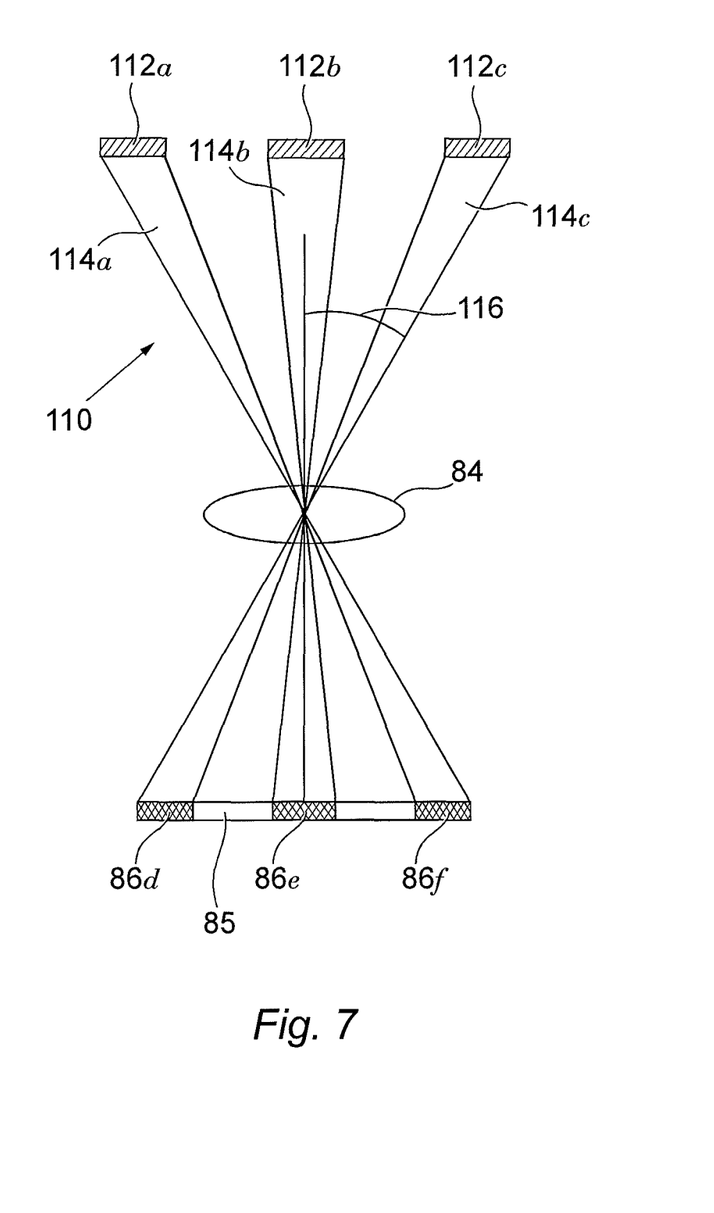
FIG. 7 shows a section through a sensor array microchip according to an embodiment of the present disclosure arranged as an ambient light sensor package or a combined ambient light sensor package and proximity sensor package.

FIG. 7 shows a section A-A through the pixel array microchip 80 and the lens 84 of FIG. 4. FIG. 7 further shows the field of regard 110 of the sensor array microchip 80 in combination with the lens 84. Where components similar to those of FIG. 4 are shown, the same reference numerals are used.

From FIG. 7 it can be seen that light from specific regions 112a-c of the field of regard 110 will be focused by the lens 84 onto the pixels 86d-f. The regions in object space corresponding to the pixels in FIG. 4 have been shown assuming a basic geometric model of optics. However, in reality they will be extended by a combination of distortion, field curvature and defocus aberrations. Naturally the concept of spatially separated pixels can be extended to include more pixels. The pixels may be configured to cover a greater or smaller field of regard.

The skilled person will understand that the regions 112a-c of the field of regard 110 will be of the same number and will have a similar shape to each of the pixels 86a-i of the sensor array of FIG. 4. In effect each region represents a separate viewing cone 114a-c for each pixel 86d-f. The pixel array of FIG. 4 will comprise 9 such separate viewing cones, one for each pixel.

The light incident on the lens 84 from each of the separate viewing cones will be focused by the lens 84 onto a corresponding ambient light pixel. In order to estimate the level of ambient light across the entire field of regard 110, the outputs from each of the ambient light pixels may be integrated across the field of regard 110. That is, it is possible to interpolate the outputs from the ambient light pixels into the regions of the field of regard 110 that provide light that is not focused onto a pixel by the lens 84.

In general it is possible to calculate the amount of ambient light incident on each of the ambient light pixels and linearly interpolate between the fields of regard for each ambient light pixel. In this way it is possible to determine an estimate of the ambient light across a field of regard expressed by the half angle 116 shown in FIG. 7. That is, an estimate of the ambient light across a field of regard defined by the outer viewing cones 114a and 114c of FIG. 6. Other methods of interpolation may be used without departing from the scope of the present disclosure.

In this way, the separate viewing cones 114a-c as well as those corresponding to other pixels that cannot be seen in FIG. 5 represent the entire field of regard 110. The sensor array microchip of the invention therefore allows a wide field of regard to be defined by the positions of the spatially separated ambient light pixels 86a-i arranged on the substrate 85.

An alternative method of interpolation may be to assume that the light falling on the distributed pixel array through a lens from a field of regard with a half angle of theta will be reduced by a geometric factor of cosine cubed theta ($\cos^3(\theta)$), where it is assumed that the ambient environment forms the inside of a hemisphere. The values for the ambient radiation may then be taken from the pixel or pixels in each matrix element and multiplied by $1/\cos^2(\theta)$ to remove the effect of the lens over that from a naked sensor. The resultant values for each matrix element may be averaged to arrive at an estimate of ambient radiation.

In further embodiments, if the lens is slightly defocused, towards the sensor the fields of view of the individual matrix elements can be made to over lap at a given distance from the sensor to give full field coverage.

In some embodiments of the invention a microprocessor may be configured to estimate the ambient light across the field of regard using the methods referred to above. The microprocessor may for example be located on the sensor array microchip.

The term "wide field of regard" is intended to encompass a field of regard of an ambient light sensor package that is wide enough to give a useful measurement of the ambient light. The measurement may for example be used in a device with a display to determine the effect ambient light has on perceived display brightness. The width of a field of regard is defined by the angle between a normal perpendicular to a pixel array and the limit of the field of regard. The limit of a field of regard is the greatest angle to the normal from which light may be incident on a pixel array. Therefore, a field of regard having a half angle of ninety degrees accepts light from the entire hemisphere of illumination.

A wide field of regard may specifically refer to a field of regard with a half angle of between thirty degrees and forty-five degrees. Alternatively, a wide field of regard may refer to a field of regard with a half angle of up to eighty degrees. Alternatively, a wide field of regard may refer to a field of regard with a half angle of between forty-five degrees and seventy degrees. Alternatively, a wide field of regard may refer to a field of regard having a half angle of sixty degrees. Alternatively, a wide field of regard may refer to a field of regard with a half angle of thirty degrees.

The ambient light sensor package shown in FIGS. 4-7 may further comprise a filter (not shown) arranged to allow only specific predetermined frequency ranges of light onto the pixel array. The lens 84 may comprise the filter. That is, the lens 84 may be configured to also filter out certain frequencies of the light spectrum. In other embodiments the filter may be a separate element to the lens 84. The filter may, for example, be formed on a pixel using microchip manufacturing techniques.

For the ambient light sensor of FIGS. 4-7, the filter is arranged to be a bandpass filter. The bandpass filter is further arranged to allow only photopic light to pass through the filter onto the pixel array. In this way, the ambient light sensor package may be configured only to measure the light incident on the pixel array in the frequency corresponding to natural daylight.

In a further embodiment of the invention, the sensor array microchip may be a combined ambient light sensor package and proximity sensor package. The sensor array microchip may therefore be a dual band sensor system located on a single sensor array microchip.

In this embodiment at least one of the plurality of sensor elements is a proximity sensor. The proximity sensor may comprise at least one pixel. The term "proximity pixel" as used herein refers to a pixel of a pixel array that is used to sense proximity as described above.

The skilled person will understand that an ambient light pixel and a proximity pixel may have the same physical make-up. That is to say that they may both comprise the same type of sensor. The ambient light pixels and the proximity pixel may for example be photodiodes. Further, the ambient light pixels and the proximity pixel may be single photon avalanche diodes (SPADs).

The ambient light pixels and the proximity pixel may be configured to detect light of different frequencies or wavelengths. For example, the ambient light pixels may be configured to detect photopic light, whereas the proximity pixel may be configured to detect infra-red light.

Generally, proximity sensor packages comprise a light source, such as an LED and a proximity sensor configured to detect light emitted by the light source and reflected from nearby objects. The light source may emit infra-red light. If an object is in close proximity to the source then infra-red light will be reflected from the object. If the reflected infra-red light is detected by a proximity pixel then the sensor package is able to indicate the proximity of the object and a device is able to take appropriate action.

Proximity sensor packages require a narrow field of regard. This is so that any ambient light detected by the proximity pixel is of a sufficiently low level to allow any infra-red light detected by the proximity pixel to be distinguishable over it. That is, there is a need for any illumination source (such as an LED) used to overcome the in band ambient illumination effect on proximity sensing.

Therefore, the term "narrow field of regard" encompasses a field of regard that allows reflected light incident on a proximity sensor to overcome the in band ambient light. A narrow field of regard may for example be, for an LED based solution, a viewing cone that remains inside the LED illumination pattern over the required proximity sensing range.

LEDs may have fields of regard with half angles (measured at half the maximum intensity) in the order of twenty degrees. A narrow field of regard may therefore refer to a field of regard having a half angle of twenty degrees. Alternatively, a narrow field of regard may refer to a field of regard having a half angle of between one degree and ten degrees. Thus the narrow field of regard is inside the cone of illumination of the illumination source. However, it can be envisaged that the cone of illumination of an illumination source could be narrower than the field of regard of a proximity sensor. In certain embodiments the radiation distribution from the illumination source and the field of regard of the proximity sensor may overlap under all production tolerances.

The narrow field of regard required by proximity pixels is at odds with the wide field of regard required for ambient light sensing. If a lens of a given focal length is used to give the required viewing cone for the narrow field of regard for proximity sensor function, the wide field of regard condition of an ambient light sensor function may be provided by extending the sensor array by adding more sensor elements (as in FIG. 1). However this will extend the area of the sensor device beyond that which is regarded as economical.

It is noted that if a SPAD, or other rapid sampling sensor element, is used for proximity sensing, then it would require to be read out in a different manner from a conventional pixel array.

Referring to FIGS. 4 and 7, the centrally located pixel 86e within the matrix may be a proximity pixel. The remaining pixels 86a-d, 86f-i may be ambient light pixels. Therefore, by interpolating the outputs of the ambient light pixels 86a-d, 86f-i an estimate of the ambient light in the entire field of regard defined by the half-angle 116 is provided. This allows the sensor array microchip to be used for ambient light sensing. Further, the separate field of regard 114b corresponding to proximity pixel 86e provides a narrow field of regard incident on pixel 86e. Therefore, the output of pixel 86e may be used in proximity sensing. In this way the invention provides a dual band sensor system on a single sensor array microchip.

In some embodiments the proximity pixel 86e may be used as an ambient light pixel when ambient light sensing function is required, and as a proximity pixel when proximity sensing function is required. The output of the pixel 86e may be used as part of the interpolated estimate of ambient light across the entire field of regard.

The skilled person will understand that the central pixel 86e may comprise more than one pixel. The proximity pixel may comprise a plurality of pixels grouped together within the central matrix element.

In embodiments of the invention providing a combined ambient light sensor function and a proximity sensor function the filter referred to above is a dual bandpass filter. The dual bandpass filter allows both light in the photopic frequency range and light in the infra-red frequency range to pass onto one or more of the plurality of sensor elements.

Figure 8:
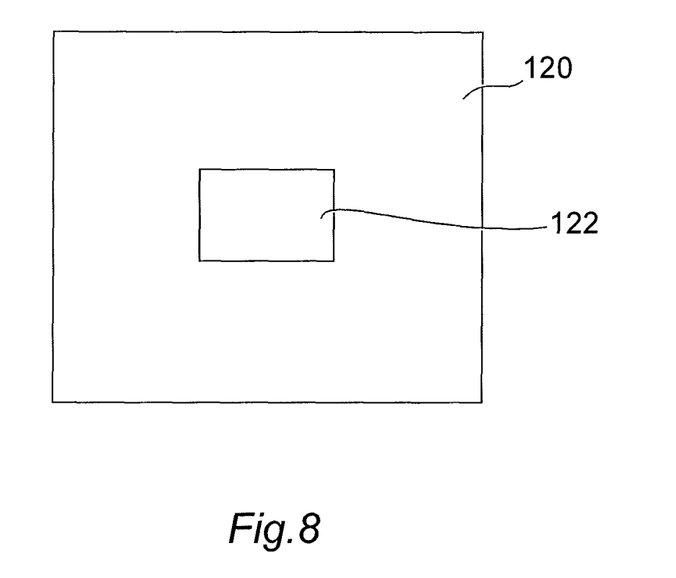
FIG. 8 shows a device comprising a sensor array microchip according to embodiments of the present disclosure.

Sensor array microchips according to the present disclosure can be incorporated in a wide variety of devices. FIG. 8 shows an example of a device 120 incorporating a sensor array microchip 122 according to the disclosure. The device 120 may be without limitation a mobile telephone or other mobile device, a laptop, a webcam, a televisions, any other consumer electronic item with a display, a scanner (including hand held or flat bed scanners), other document scanning equipment, industrial measurement equipment or machine vision equipment. The sensor array microchip 122 may be incorporated into that device 120 depending upon the nature of the device in a manner which is known to a person skilled in the art and which does not require further exemplification herein.

The invention provides a means of extending the effective field of view for an ambient light sensor package without affecting the proximity sensor function. With a minimal loss of accuracy the ambient light can be sensed at a number of intervals across the field of regard and inferred from those sensing points as mentioned above. Therefore the ambient light pixels can be distributed across the sensor surface in a spatially separated manner. As such there now exists space in which other electronic functionality can be placed on chip.

The invention as described herein provides a viewing cone or field of regard synthesized by a small number of sensor elements. Further, a compact electronic design can be achieved for a wide viewing cone or field of regard. In addition, the support electronics needed for a number of small arrays can take up less area than that for one large area array with many pixels. The configuration of the invention allows the use of central array for a narrow viewing cone function, namely proximity sensing.

The skilled person will be able to identify other embodiments without departing from the scope of the invention as claimed.

What is claimed is:

1. A light sensor package, comprising:
    a sensor array microchip, the microchip comprising:
        a substrate; and
        a plurality of ambient light pixels arranged on the substrate, wherein each of the plurality ambient light pixels is spatially separated from at least one other of the plurality of ambient light pixels; and
    a lens connected to a mount wherein the mount is secured to the substrate to hold the lens in a fixed orientation to the substrate,
    wherein the plurality of ambient light pixels are positioned on the substrate to cooperate with the lens to define a wide field of regard of the sensor array microchip; and
    a proximity sensor including at least one proximity pixel positioned to cooperate with the lens to define a narrow angle of regard relative to the wide angle of regard for the ambient light pixels.

2. The package according to claim 1 wherein the spatially separated ambient light pixels are arranged to allow additional electronic elements to be arranged on the substrate between the spatially separated ambient light pixels.

3. The package according to claim 1 wherein the plurality of ambient light pixels are distributed in a matrix including a plurality of elements and wherein one or more elements of the matrix comprises one or more of the plurality of ambient light pixels.

4. The package according to claim 3 wherein the matrix is a square matrix.

5. The package according to claim 1 wherein the plurality of ambient light pixels comprise single photon avalanche diodes.

6. The package according to claim 1, wherein two or more of the ambient light pixels form an ambient light sensor.

7. The package according to claim 1 wherein the wide field of regard has a half angle of ninety degrees.

8. The package according to claim 1 wherein the wide field of regard has a half angle of between forty-five degrees and seventy degrees.

9. The package according to claim 1 further comprising a microprocessor configured to calculate the ambient light present within the field of regard by interpolating across the field of regard the outputs of the ambient light pixels.

10. The package according to claim 1 further comprising a filter configured to allow light of at least one predetermined frequency to pass onto the ambient light pixels.

11. The package according to claim 10 wherein the filter is configured to allow photopic light to pass onto the ambient light pixels.

12. The package according to claim 1 wherein the at least one proximity pixel comprises a single photon avalanche diode.

13. The package according to claim 1 wherein said at least one proximity pixel comprises at least one of the ambient light pixels.

14. The package according to claim 1 further comprising a filter wherein the filter is configured to allow light of at least one predetermined frequency to pass onto the ambient light pixels and is further configured to allow infra-red light to pass onto the at least one proximity pixel.

15. The package according to claim 14 wherein the ambient light pixels, the at least one proximity pixel, the lens and the filter are configured to focus photopic light on the ambient light pixels, and infra-red light on the at least one proximity pixel.

16. The package according to claim 1 wherein said package including ambient light sensing and proximity sensing is part of a device.

17. A package, comprising:
a substrate;
power supply circuitry formed on said substrate;
processing circuitry formed on said substrate;
a plurality of ambient light pixels arranged on the substrate, wherein each of the plurality ambient light pixels is spatially separated from at least one other of the plurality of ambient light pixels;
a lens connected to a mount wherein the mount is secured to the substrate to hold the lens in a fixed orientation to the substrate;
wherein the plurality of ambient light pixels are positioned to cooperate with the lens to define a wide field of regard; and
wherein said power supply circuitry and said processing circuitry are positioned on the substrate between two or more of the ambient light pixels.

18. The package of claim 17 wherein said power supply circuitry comprises circuitry configured to generate and supply a regulated power supply to the ambient light pixels, and said processing circuitry is configured to control operation of the ambient light pixels and process signals output from the ambient light pixels.

19. The package of claim 17 wherein the substrate has a peripheral edge and said plurality of ambient light pixels are formed on said substrate at positions along said peripheral edge.

20. The package of claim 17 wherein the field of regard has a half angle of at least thirty degrees.

21. The package of claim 17 wherein the field of regard has a half angle of at least forty-five degrees.

22. The package of claim 17 wherein the field of regard has a half angle of at least sixty degrees.

23. The package of claim 17 wherein each ambient light pixel positioned on the substrate defines using the lens a corresponding plurality of separate imaging regions within the field of regard.

24. The package of claim 17 further comprising a proximity sensor element.

25. The package of claim 24 wherein the plurality of ambient light pixels surround the proximity sensor element.

26. The package of claim 25 wherein the surrounding ambient light pixels are positioned on the substrate such that the lens element defines an ambient field of regard having a first half angle, and the surrounded proximity sensor element is positioned on the substrate such that the lens element defines a proximity field of regard having a second half angle smaller than the first half angle.

27. The package of claim 26 wherein the first field of regard has a half angle of at least thirty degrees and the second field of regard has a half angle less than twenty degrees.

28. The package of claim 26 wherein the first field of regard has a half angle of at least forty-five degrees and the second field of regard has a half angle less than ten degrees.

29. The package of claim 26 wherein the first field of regard has a half angle of at least sixty degrees and the second field of regard has a half angle less than ten degrees.

30. The package of claim 25 wherein the surrounded proximity sensor element is further operable as an ambient light sensor element in addition to said plurality of surrounding ambient light pixels.

31. The package of claim 30 further comprising a dual bandpass radiation filter positioned over the surrounded proximity sensor element, said filter configured with a first bandpass in a photopic range for ambient light sensing and a second bandpass in an infrared range for proximity sensing.

* * * * *